(12) United States Patent
Chon

(10) Patent No.: US 11,609,088 B2
(45) Date of Patent: Mar. 21, 2023

(54) SYSTEMS AND METHODS FOR MEASURING PATTERNS ON A SUBSTRATE

(71) Applicant: Sangu Chon, Fort Lee, NJ (US)

(72) Inventor: Sangu Chon, Fort Lee, NJ (US)

( * ) Notice: Subject to any disclaimer, the term of this patent is extended or adjusted under 35 U.S.C. 154(b) by 326 days.

(21) Appl. No.: 16/860,943

(22) Filed: Apr. 28, 2020

(65) Prior Publication Data

US 2020/0363195 A1 Nov. 19, 2020

Related U.S. Application Data

(60) Provisional application No. 62/848,211, filed on May 15, 2019.

(51) Int. Cl.
| | | |
|---|---|---|
| *G01B 11/28* | (2006.01) | |
| *G01B 11/24* | (2006.01) | |
| *G01B 11/02* | (2006.01) | |
| *G01N 21/956* | (2006.01) | |
| *G01N 21/64* | (2006.01) | |
| *G01N 21/95* | (2006.01) | |

(52) U.S. Cl.
CPC .............. *G01B 11/28* (2013.01); *G01B 11/02* (2013.01); *G01B 11/24* (2013.01); *G01N 21/64* (2013.01); *G01N 21/9501* (2013.01); *G01N 21/956* (2013.01); *G01B 2210/56* (2013.01)

(58) Field of Classification Search
CPC ......... G01B 11/28; G01B 11/02; G01B 11/24; G01B 2210/56; G01N 21/64; G01N 21/9501; G01N 21/956; G03F 7/70625; G03F 7/70616; H01L 22/12; H01L 22/22
See application file for complete search history.

(56) References Cited

U.S. PATENT DOCUMENTS

| | | | | |
|---|---|---|---|---|
| 6,556,652 B1 * | 4/2003 | Mazor | ................... | G01N 23/201 378/71 |
| 10,726,543 B2 * | 7/2020 | Bian | ........................ | G06T 7/001 |
| 10,908,506 B2 * | 2/2021 | Kim | ........................ | G03F 7/705 |
| 2007/0042390 A1 * | 2/2007 | Borden | ................... | B82Y 15/00 435/7.1 |
| 2011/0269061 A1 * | 11/2011 | Yoshihara | ............. | G03F 7/0035 430/30 |

\* cited by examiner

*Primary Examiner* — Hung V Nguyen

(74) *Attorney, Agent, or Firm* — The Patent Practice of Szmanda & Shelnut, LLC; Charles R. Szmanda; James G. Shelnut

(57) ABSTRACT

Disclosed herein is a method of measuring a pattern on a substrate comprising: preparing a substrate having a relief pattern comprising organic or inorganic material; directing an excitation light to the relief pattern on the substrate to emit a fluorescent light from the relief pattern; detecting an intensity of the fluorescent light emitted from the relief pattern; and determining a volume of the relief pattern on the substrate based on the detected intensity of the fluorescent light.

19 Claims, 5 Drawing Sheets

SYSTEMS AND METHODS FOR MEASURING PATTERNS ON A SUBSTRATE

BENEFIT CLAIM

The present application claims the benefit of provisional application No. 62/848,211, filed 15 May 2019, which application is incorporated by reference in its entirety.

BACKGROUND OF THE INVENTION

This disclosure relates to a measurement and a control of a volume and a critical dimension (CD) of a structure or a pattern on a substrate. In particular, this disclosure relates to a system and a method for measuring the structure and the pattern on the substrates including a semiconductor wafer.

Advances in computing power and information sharing are the result of increased speed of semiconductor devices and increased bandwidth of communications links. The increased speed of the semiconductor devices, such as processors and memories, requires tighter design rules. Accordingly, patterns are now being formed that are less than one micron in width and smaller. Similarly, transmitters for optical fiber links, such as distributed feedback lasers, require generation of periodic structures and patterns with sub-micron volumes and critical dimensions (CDs).

Processing methods to generate sub-micron volumes and CDs typically employ a photolithography process. The photolithography process is a micro-fabrication technique that transfers images of devices using a very high resolution imaging system to create latent patterns in organic photo-sensitive material, typically called photoresist. These latent patterns can be developed into relief patterns to function as structures or etch masks to create structures and patterns in underlying materials. Subsequent micro-fabrication processes use plasma etching transfer a relief pattern in photoresist to a permanent or temporary structure to form a semiconductor device pattern or part thereof. Resulting dimensions of such relief patterns directly influence device performances. Thus, controlling such dimensions precisely leads to properly functioning semiconductor devices. Poor dimension control can lead to device failures.

Conventional methods of dimensional metrology are executed using very highly magnified electron microscope images, such as 100,000-500,000 fold magnification, using a scanning electron microscope to measure a given pattern width on a wafer. Measuring SEM (Scanning Electron Microscope) can be used for individual device measurement, or CD (Critical dimension)-SEM can be use. In practice, a measurement target pattern image is captured in a local region. Signal waveform patterns longitudinally to create an image profile obtained by adding an average of the left and right patterns detected in this profile dimension between measuring points, and then pattern size is calculated as a distance. Using the scanning electron microscopy (SEM) is a useful technology to measure dimensions of the devices and to measure any kind of shapes and sizes.

Electron microscope imaging, however, is very slow process. Another challenge is that a vacuum process is also required with the SEM imaging. Thus total measurement speed is very slow compared to production speed of the photolithography process. Because of these challenges, the SEM imaging is a very limited in amount of devices that are measured, especially for high-volume manufacturing.

Limitation of sampling and measurement results in many of problems that remain hidden and undetectable until final devices are electrically tested. Failure of device dimensional control yields poor performance of devices or even non-working devices. Thus, demands to measure more area of a wafer and to measure more total wafers are increasing.

Another method of metrology uses the diffraction nature of light which called scatterometry. Scatterometry has also been used to measure linewidths, but this process requires several detectors arranged at different angles with respect to an incident beam to measure different diffracted orders.

For example, U.S. Pat. No. 5,114,233 given to Clark et al., teaches a method for inspecting etched workpieces wherein a beam of coherent light is directed at the workpiece and the intensity of scattered light is measured over several orders of diffraction. A spatial frequency is then computed for each intensity measurement. The scattered light is detected by a photodiode which is preferably mounted on a rotating arm whose axis is aligned to the target area of the workpiece. The angular range is about 90 degrees to 180 degrees in which several hundred intensity measurements are made and recorded. An envelope of intensity versus spatial frequency is next approximated to form a matrix from which principal components are determined. Correlations are made to etching characteristics of the workpiece, such as undercut profiles or tapered profiles. While this is a nondestructive test, it would be difficult to implement for in-situ processing in a vacuum chamber because of the range of diffracted angles that need to be scanned.

Scatterometry is a useful tool to measure small structures with periodic structures. However, it is impossible to measure non-periodic structures. Also it is difficult to measure long period structures. In real device fabrication, device patterns need to be monitored. Many device patterns, however, are not periodic. Moreover, underlying structure variation adds too many parameters to model with scatterometry. Thus, only specially designed targets can be used.

Another conventional metrology technique is ellipsometry, and has been used to measure a thickness of various films (R. M. A. Azzam and N. M. Bashara, "Ellipsometry and Polarized Light", North Holland, 1987). If ordinary white light is sent through a polarizer, the light emerges as linearly polarized light in which its electric field vector is aligned with an axis of the polarizer. Linearly polarized light can be defined by two vectors, parallel and perpendicular to the plane of incidence. If the parallel vector is out of phase with the perpendicular vector, the result is elliptically polarized light. If both vectors are in phase, the result is circularly polarized light. Ellipsometry is based on the polarization transformation that occurs when a beam of polarized light is reflected from a medium. The transformation consists of two parts: a phase change and an amplitude change. These changes are different for incident radiation with its electric vector oscillating in the plane of incidence (p-component) compared to the electric vector oscillating perpendicular to the plane of incidence (s-component). Ellipsometry measures the results of these two changes which are conveniently represented by an angle DELTA ($\Delta$), which is the change in phase of the reflected beam from the incident beam; and an angle PSI ($\Psi$), which is defined as the arc tangent of the amplitude ratio of the incident and reflected beam. Since the reflected beam is fixed in position relative to the incident beam, ellipsometry is an attractive technique for in-situ control of processes which take place in a chamber. The angle of incidence and reflection are equal, but opposite in sign, to each other and may be chosen for convenience in directing the beam into the chamber. For example, U.S. Pat. No. 5,131,752 given to Yu et al., teaches the use of ellipsometry to monitor the thickness of a film as it is deposited on a workpiece. The method is limited to planar surfaces though.

SUMMARY

There is an increased need in the art of measurement and in process control for a method to accurately measure the dimensions of periodic patterns, particularly those with dimensions in the range of less than one micron to a few microns and even smaller with nanometer scale structures. Such a method is should be nondestructive and amenable to in-situ process control as the patterns are being etched in a chamber. Additionally, in-situ process control should also have the advantage to improve yield, contribute to uniformity across a wafer and across a lot, and thereby improve device reliability. Techniques herein provide such nondestructive, in-situ metrology techniques capable of rapid measurement compatible with high-volume manufacturing flows.

Techniques herein include systems and methods that measure volumes or CDs of organic patterns by measuring total amount of fluorescent light from a fixed or premeasured amount of excitation light (e.g., UV beam) directed to the organic material.

When organic material is illuminated with short wavelength light, the organic material will emit longer wavelength light, which is called fluorescent light. A given intensity of the fluorescent light will be dependent on an intensity of the excitation light, material composition and amount of the organic material. When the material composition and the intensity of the excitation light are fixed, then an amount of the fluorescent light emitted is proportional to a volume of the organic material when the organic material is sufficiently transparent. The majority of organic materials used in semiconductor patterning are transparent in the visible wavelength. Because of this material selection, intensity of fluorescent light is then proportional to the volume of organic material on a substrate (wafer).

By knowing design characteristics of a device or particular pattern, a desired volume of organic material in a certain area can be calculated. Additionally, fluorescent intensity of known sized material can be measured. Known sized calibration material can either be a blanket film or a pattern with dimension measured with electron microscopy.

By comparing a design targeted volume and a ratio of measured intensity of the fluorescent light between target device and a known volume reference, device size can be calculated or otherwise generated. Since this method measures organic material amount, there is no impact from or by underlying structures. Also, because only an intensity measurement is required, measurement time can be much faster than conventional metrology methods. Additionally, no complicated modeling is necessary for metrology techniques herein. Accordingly, techniques herein provide systems and methods that measure quick enough for use with high-volume manufacturing, and can measure an entire wafer surface.

The drawings are not to scale.

DETAILED DESCRIPTION

Figure 1:
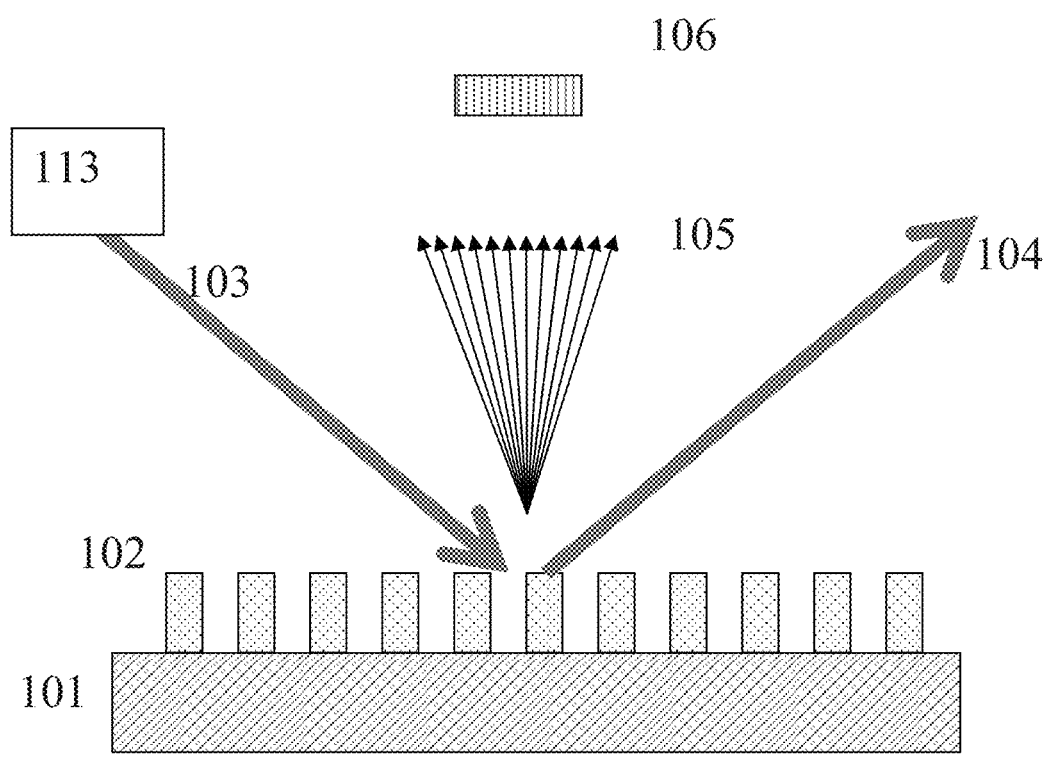
FIG. 1 is a schematic illustration of a method of measuring intensity of a fluorescent light in a measurement system according to an embodiment of the disclosure.

Referring now to FIG. 1, a method of a measuring intensity of a fluorescent light according to an exemplary embodiment of the disclosure may include preparing or receiving a silicon substrate 101. For example, a system according to an exemplary embodiment of the disclosure may receive the silicon substrate 101. Organic patterns 102 may be formed on the substrate 101. The organic patterns 102 may be a line shape. For example, the organic patterns 102 may include a plurality of lines in parallel with one another. An intensity-regulated UV (ultra-violet) beam 103 (e.g., an excitation light), from a light source 113, may illuminate with a silicon substrate 101 and organic patterns 102. The UV beam 103 may be directed with a predetermined intensity, e.g., first regulated (excitation) intensity. The directing or illuminating the substrate 101 and the organic patterns 102 with the UV beam 103 may include performing or executing a flood exposure. For example, entire surface of the substrate 101 and the organic patterns 102 may be exposed with the UV beam 103. In one embodiment, the method may include scanning a work surface (i.e., upper surface) of the substrate 101 with the UV beam 103. In one embodiment, the light source 113 may include a plurality of unit light sources. The sensor 106 may include a plurality of unit sensors. These may result in an UV light 104 reflected from substrate 101, and a fluorescent light 105 emitted from the organic patterns 102. A sensor 106 may be positioned to detect and sense the fluorescent light 105 emitted from the organic patterns 102. Based on the detected amount or intensity of the fluorescent light 105, a volume or critical dimensions (CDs) may be calculated. In one embodiment, intensity of the emitted fluorescent light 105 may be measured or detected by the sensor 106 for a given spatial location on the substrate 101, and the volume or CDs of the organic patterns 102 may be determined or calculated based on the intensity of the detected fluorescent light 105. In one embodiment, intensity of the emitted fluorescent light 105 may be measured or detected by the sensor 106 for a plurality of spatial locations across the substrate 101, and the volume or CDs of the organic patterns 102 may be determined or calculated based on the intensity of the detected fluorescent light 105. Calculating the volume or CDs may be performed in a processor in the system. The processor can calculate the volume or CDs of the organic patterns 102 based on detected light intensity of emitted fluorescent light 105, organic material characteristics, and excitation light characteristics. The intensity-regulated UV beam 103 may be sourced from a UV laser, for example, which can be generated by high order harmonics. There are many wavelengths that will work herein to cause fluorescent light to be emitted. For example, wavelengths below 450 nm may cause sufficient fluorescent light to be measured. Note that shorter wavelengths may provide better efficiency of fluorescent light generation. Example wavelengths of the excitation light 103 may include 193 nm, 213 nm, 248 nm, 266 nm, or others. The fluorescent light 105 may propagate all directions. Accordingly, to make more efficient capturing, large angled sensors may be used in the sensor 106. In this example embodiment, fluorescent beam intensity may represent an average size of pattern in the illuminated area. In one embodiment, the method may include identifying design measurements (targeted volume and CDs) of the organic patterns 102, comparing the design measurements with the calculated volume or CDs of the organic patterns 102, and amending the design measurements.

Figure 2:
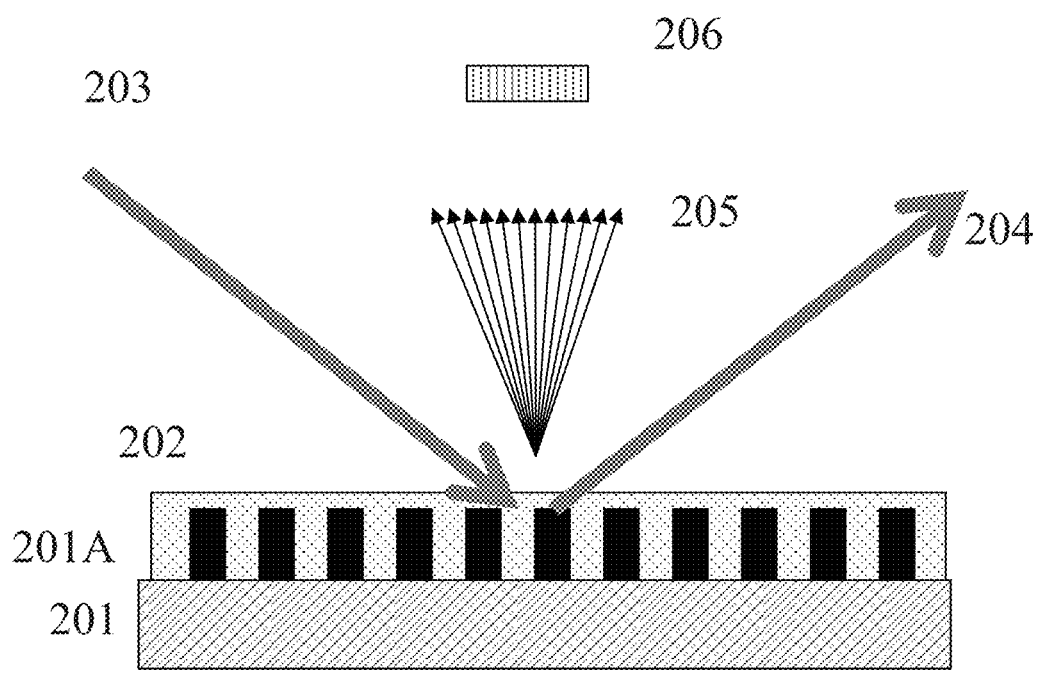
FIG. 2 is a schematic illustration of a method of measuring intensity of a fluorescent light in a measurement system configured to measure non-organic (e.g., inorganic) material pattern according to an embodiment of the disclosure.

In some embodiments it is desirable to measure a volume or CDs of inorganic material patterns on a substrate 101. Such a measurement is executed by filling spaces between the inorganic material patterns with an organic material, measuring a volume or CDs of the organic material, and then calculating (volume or CD) of the inorganic material patterns. Referring now to FIG. 2, a non-organic material structure 201A (e.g., inorganic material pattern) may be formed on a substrate 201. The non-organic material structure 201A may be a line-shaped relief pattern. For example, the non-organic material structure 201A may be a relief pattern in form of a plurality of lines parallel with one another. A sacrificial organic material 202 may be added or formed between and/or over the non-organic material structure 201A for measurement. An amount of fluorescent light 105 emitted from the substrate 201 may be proportional to a size of a spacing of pattern which is filled by the sacrificial organic material 202. After measurement, the sacrificial organic material 202 can be easily removed using a solvent or plasma ashing.

Figure 3:
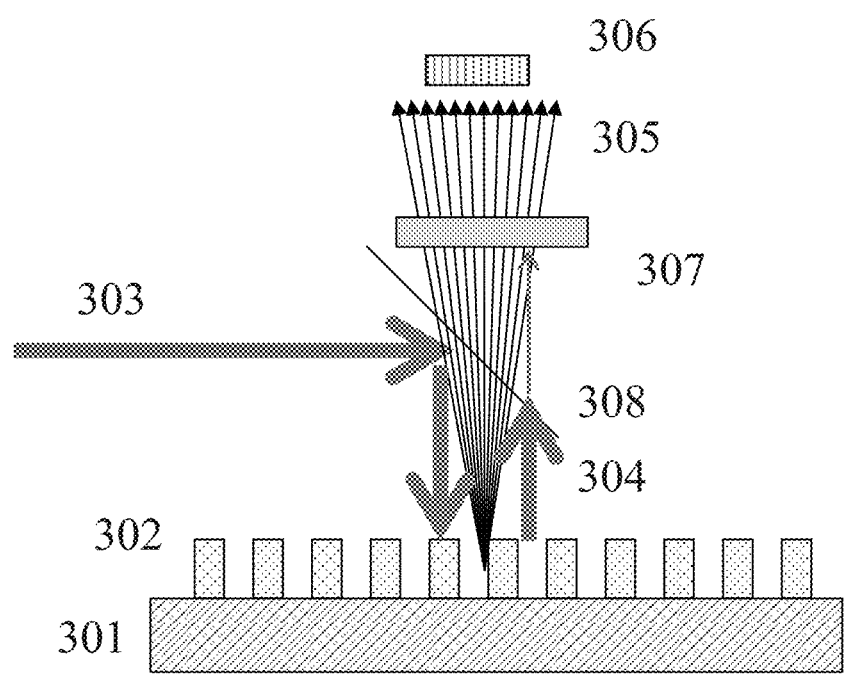
FIG. 3 is a schematic illustration of a method of measuring intensity a fluorescent light in a system according to an embodiment of the disclosure.

FIG. 3 illustrates another configuration of a system. To measure more accurately, precise control of incidence angle and detection (emission) angle can be beneficial. Thus, a UV beam 303 may be directed to illuminate near vertically with a surface of a substrate 301 using a beam split mirror (beam splitter) 308. The beam splitter may split the UV beam 303. For example, the beam split mirror 308 may be configured to reflect only the UV beam 303 and transmit only lights having longer wavelengths. Thus, only the UV beam 303 can be reflected from the beam split mirror 308 and directed to the sacrificial organic material 302. To measure intensity of the fluorescent light accurately, intensity of the UV beam 303 should be eliminated from the reflected and emitted light 304. Thus, an optional UV filter 307 may be positioned between the beam split mirror 308 and the sensor 306 to filter any remaining UV light from the reflected and emitted light 304 so that the fluorescent light 305 reaches a sensor 306 without UV light.

Figure 4:
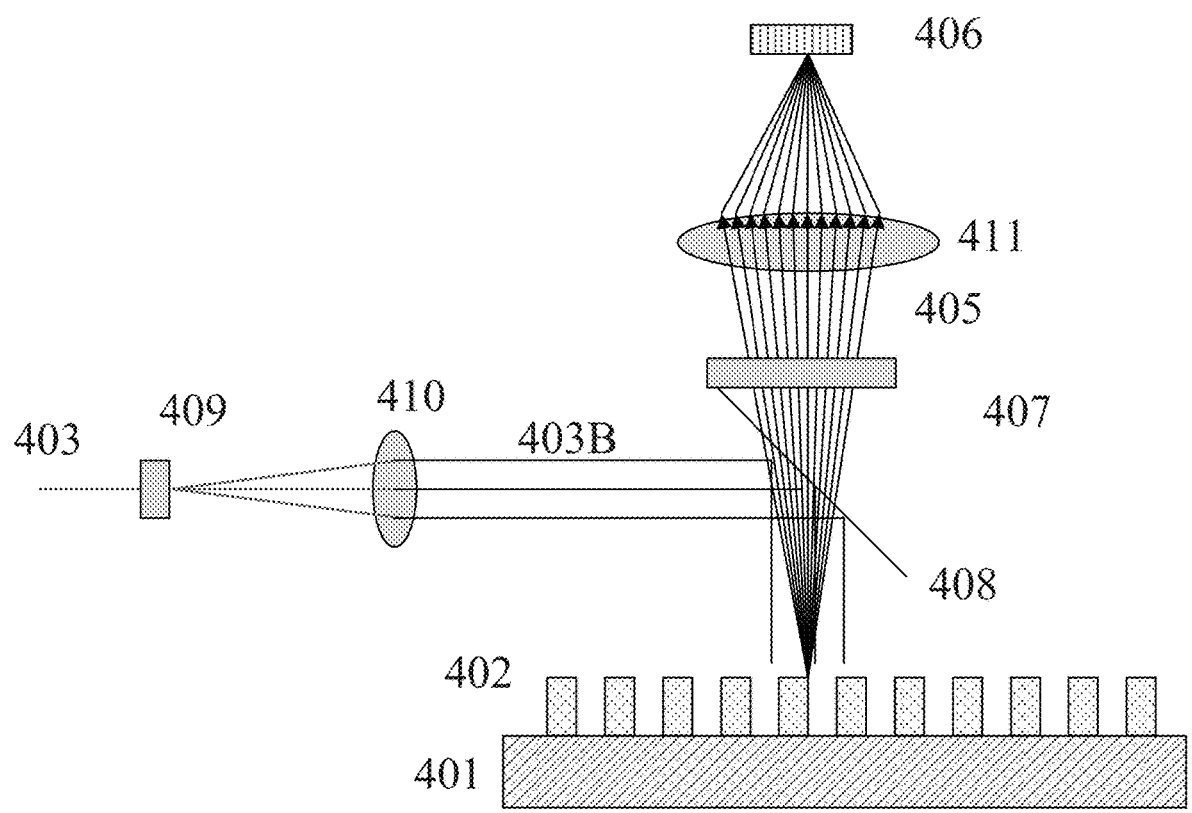
FIG. 4 is a schematic illustration of a method of measuring intensity of a fluorescent light in a high resolution system according to an embodiment of the disclosure.

FIG. 4 illustrates a method of measuring intensity of fluorescent light in another example configuration of a system for very high resolution measurement. Instead of a single point beam 403, a structure beam 403B can be directed at a substrate 401. Using a diffuser 409 and a shaping lens 410, the single point beam 403 can be shaped into the structure beam 404B for illuminating a relatively wide area of a pattern 402, and the wide area of the pattern 402 may be illuminated with a uniform dose. Non-uniform intensity can be calibrated using known device structures. Then using a camera lens 411 with an area sensor 406, a large number of intensities of fluorescent light 405 can be measure rapidly. For example, if a given illuminated area is 1×1 cm and a 1000×1000 pixel camera (or a CMOS sensor) is used, then a single image can measure 1 million points and sampling resolution can be 10 μm. By using this setup, a billion line width data can be measured in a relatively short time. The systems illustrated in FIGS. 1 to 4 may be positioned within semiconductor manufacturing apparatus. For example, the systems illustrated in FIGS. 1 to 4 may be one of the semiconductor manufacturing apparatuses. The systems illustrated in FIGS. 1 to 4 may further include a processor to calculate the volume or CDs of the patterns 102, 201A, 202, 302, and 402 based on intensities of the detected (emitted and sensed) fluorescent lights 105, 205, 305, and 405 by the sensors 106, 206, 306, and 406.

Figure 5:
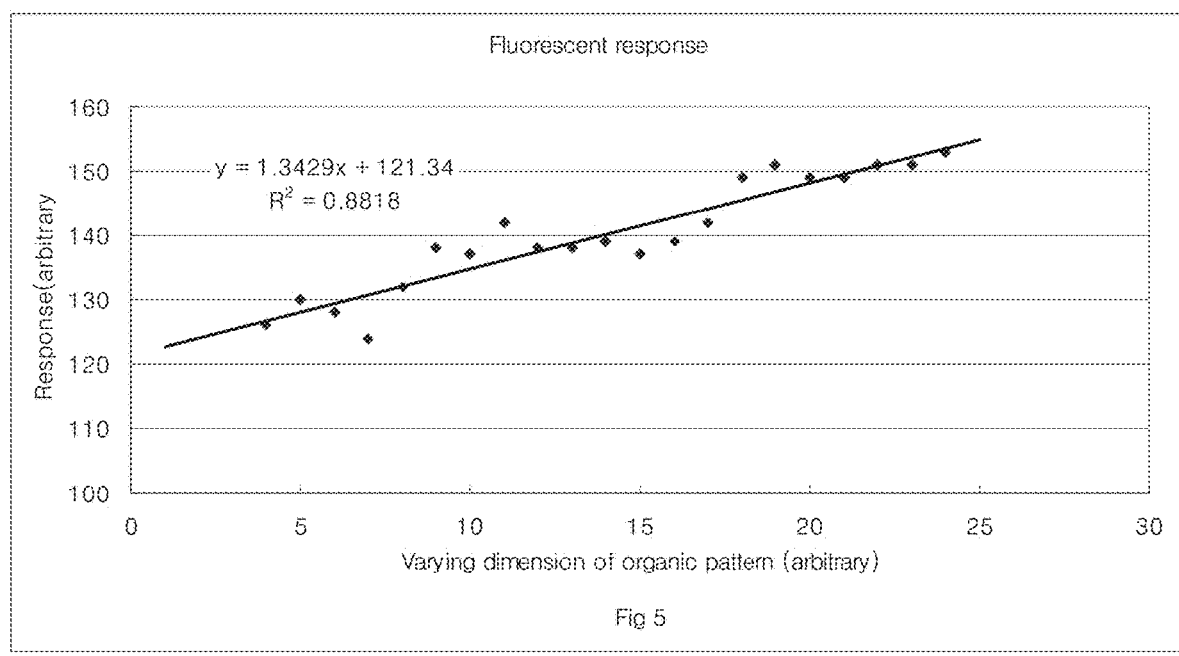
FIG. 5 is a table of measurement results for dimensional metrology.

FIG. 5 shows experimental results of measuring of intensity of fluorescent light emitted from the organic patterns. The x-axis is varied size of the organic patterns and the y-axis is measured intensity of fluorescent light.

As can be appreciated, various configurations of light sources, light directing mechanism, light filters, light shaping mechanisms, and detectors, and arrays can be used with embodiments herein. With discoveries herein that an organic material can give off the fluorescent light in proportion to a material size and an excitation light intensity, systems and methods can be used to measure volume and CDs of various micro or nano-fabricated structures. By calibrating system with known volumes and types of organic materials, systems can be configured for measuring volume and/or CD of other wafers. Nonorganic materials can be overcoated, such as by spin on deposition, and then measuring volume of such sacrificial organic material can be used to determine space/volume occupies by remaining nonorganic material. SEM can be used for such initial calibration, and then systems herein can be used to measure each wafer in high-volume manufacturing. Systems herein can be configured to measure a few points across a wafer or measure millions of points across a wafer.

The invention claimed is:

1. A method of measuring a pattern on a substrate, the method comprising:
    preparing a substrate having a relief pattern comprising organic or inorganic material;
    directing an excitation light to the relief pattern on the substrate to emit a fluorescent light from the relief pattern;
    detecting an intensity of the fluorescent light emitted from the relief pattern; and
    determining a volume of the relief pattern on the substrate based on the detected intensity of the fluorescent light.

2. The method of claim 1, wherein the relief pattern is a sub-micron pattern.

3. The method of claim 1, wherein directing the excitation light to the relief pattern includes illuminating the relief pattern on the substrate with ultraviolet (UV) light.

4. The method of claim 1, wherein the volume of the relief pattern is determined for one or more spatial locations across the substrate.

5. The method of claim 1, wherein directing the excitation light includes executing a flood exposure.

6. The method of claim 1, wherein directing the excitation light includes scanning across a working surface of the substrate.

7. The method of claim 1, wherein determining the volume of the relief pattern includes calculating the volume of the relief pattern at a given spatial location on the substrate.

8. The method of claim 1, wherein determining the volume of the relief pattern includes calculating a critical dimension of the relief pattern at one or more spatial locations on the substrate.

9. The method of claim 1, further comprising identifying design targeted volume of the relief pattern and comparing the design targeted volume with the calculated volume of the relief pattern.

10. The method of claim 1, further comprising measuring intensities of the emitted fluorescent light at a plurality of locations across the substrate.

11. A method of measuring a pattern on a substrate, the method comprising:
   directing a first amount of an excitation light of a first wavelength onto a substrate having an organic pattern to emit a fluorescent light from the organic pattern;
   measuring intensity of the fluorescent light emitted from the organic pattern; and
   determining a volume of the organic pattern on the substrate based on the measured intensity of the fluorescent light.

12. A system for measuring a pattern on a substrate, the system comprising:
   a light source configured to direct excitation light to an organic pattern on a working surface of a substrate;
   a light detector configured to detect intensity of emitted light from an organic pattern by directing the excitation light to the organic pattern;
   a processor configured to calculate a volume or critical dimension of the organic pattern based on the detected intensity of the emitted light, based on the organic material characteristics, and excitation light characteristics.

13. The system of claim 12, wherein the light detector includes a plurality of unit detectors.

14. The system of claim 12, further comprising a UV filter positioned to filter excitation light from the light directing to the light detector.

15. The system of claim 14, further comprising a beam splitter configured to split the excitation light before reaching the organic pattern.

16. The system of claim 12, wherein the system is positioned within a semiconductor manufacturing apparatus.

17. The system of claim 1, wherein the system includes a plurality of unit light sources and a plurality of unit sensors.

18. The method of claim 1, wherein the relief pattern includes lines; and wherein determining the volume of the relief pattern includes calculating widths of one or more lines at spatial locations across the substrate.

19. The method of claim 1, wherein determining the volume of the relief pattern includes calculating widths of lines of an inorganic pattern based on the volume of the organic pattern.

* * * * *